United States Patent
Ikejiri

(10) Patent No.: US 9,780,390 B2
(45) Date of Patent: Oct. 3, 2017

(54) SURFACE TREATMENT APPARATUS AND SURFACE TREATMENT METHOD

(71) Applicant: TOYOTA JIDOSHA KABUSHIKI KAISHA, Toyota-shi, Aichi-ken (JP)

(72) Inventor: Takashi Ikejiri, Nagoya (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 14/621,612

(22) Filed: Feb. 13, 2015

(65) Prior Publication Data

US 2015/0236359 A1    Aug. 20, 2015

(30) Foreign Application Priority Data

Feb. 14, 2014 (JP) .................. 2014-026181

(51) Int. Cl.
*C23C 16/44* (2006.01)
*H01L 21/268* (2006.01)
(Continued)

(52) U.S. Cl.
CPC ........... *H01M 8/0267* (2013.01); *C01B 13/10* (2013.01); *C23C 16/4412* (2013.01);
(Continued)

(58) Field of Classification Search
CPC .............. C23C 16/482; C23C 16/4412; C23C 16/4583; H01J 37/32339; H01J 37/32357;
(Continued)

(56) References Cited

U.S. PATENT DOCUMENTS 4,405,435 A * 9/1983 Tateishi ............... B01J 3/006
                                                       118/719
5,188,058 A * 2/1993 Nakai .................. C23C 16/455
                                                       118/719
(Continued)

FOREIGN PATENT DOCUMENTS

CN      101263749 A      9/2008
JP      7-249603         9/1995
(Continued)

*Primary Examiner* — Rudy Zervigon
(74) *Attorney, Agent, or Firm* — Finnegan, Henderson, Farabow, Garrett & Dunner, LLP

(57) ABSTRACT

The invention is equipped with a hydrophilic group generating gas supply portion, an installation stand, an irradiation device, and a flow generation portion. The hydrophilic group generating gas supply portion supplies a hydrophilic group generating gas into the treatment chamber. The installation stand is equipped with an installation plate and a support member. The installation plate has a ventilation portion, and the support member is provided protrusively from the installation plate, and supports the workpiece with an air gap left between the workpiece and the installation plate. The irradiation device irradiates the workpiece with an energy wave that induces activation of the hydrophilic group generating gas. The flow generation portion generates a flow of at least part of the activated hydrophilic group generating gas such that the hydrophilic group generating gas flows via the ventilation portion of the installation plate and flows around into the air gap.

12 Claims, 7 Drawing Sheets

(51) Int. Cl.
    *H01L 21/67*     (2006.01)
    *H01J 37/32*     (2006.01)
    *C23C 16/458*     (2006.01)
    *C23C 16/48*     (2006.01)
    *H01M 8/0267*     (2016.01)
    *C01B 13/10*     (2006.01)

(52) U.S. Cl.
    CPC ........ *C23C 16/4583* (2013.01); *C23C 16/482* (2013.01); *H01J 37/32339* (2013.01); *H01J 37/32357* (2013.01); *H01L 21/268* (2013.01); *H01L 21/2683* (2013.01); *H01L 21/2686* (2013.01); *H01L 21/67115* (2013.01)

(58) Field of Classification Search
    CPC ............... H01L 21/268; H01L 21/2683; H01L 21/2686; H01L 21/67115; H01M 8/0267; C01B 13/10; Y02E 60/50
    USPC .................. 118/719, 729; 156/345.22, 345.5
    See application file for complete search history.

(56) References Cited

U.S. PATENT DOCUMENTS

| | | | |
|---|---|---|---|
| 5,478,401 A | 12/1995 | Tsunekawa et al. | |
| 5,904,957 A * | 5/1999 | Christin | C23C 16/045 427/248.1 |
| 5,928,428 A * | 7/1999 | Horie | C23C 16/402 118/715 |
| 6,228,173 B1 * | 5/2001 | Okase | C23C 16/56 118/641 |
| 6,669,988 B2 * | 12/2003 | Daws | C23C 16/045 427/249.2 |
| 6,806,211 B2 * | 10/2004 | Shinriki | C23C 16/40 118/715 |
| 6,942,893 B2 * | 9/2005 | Delperier | C04B 35/83 118/719 |
| 7,335,397 B2 * | 2/2008 | Rudolph | C23C 16/045 427/248.1 |
| 7,476,419 B2 * | 1/2009 | Rudolph | C23C 16/045 177/245 |
| 8,293,014 B2 * | 10/2012 | Kurokawa | C23C 16/24 118/663 |
| 8,771,420 B2 * | 7/2014 | Na | H01L 21/67109 118/724 |
| 9,163,311 B2 * | 10/2015 | Hasegawa | C23C 16/45578 |
| 2003/0049372 A1 * | 3/2003 | Cook | C23C 16/24 427/248.1 |
| 2004/0040496 A1 * | 3/2004 | Ohnoda | B01J 19/123 117/200 |
| 2006/0130761 A1 * | 6/2006 | Sakai | C23C 16/45523 118/719 |
| 2007/0137570 A1 * | 6/2007 | Fukuoka | B65G 49/061 118/719 |
| 2009/0277776 A1 | 11/2009 | Kono et al. | |
| 2010/0162958 A1 * | 7/2010 | Kurokawa | C23C 16/4404 118/725 |
| 2010/0200545 A1 * | 8/2010 | Koelmel | C23C 16/4584 216/58 |
| 2011/0100955 A1 * | 5/2011 | Pushparaj | B82Y 10/00 216/37 |
| 2016/0075558 A1 * | 3/2016 | Shibuya | B01J 15/005 427/249.1 |

FOREIGN PATENT DOCUMENTS

| | | |
|---|---|---|
| JP | 2000-225337 A | 8/2000 |
| JP | 2008-166109 | 7/2008 |
| JP | 2012-200622 | 10/2012 |
| KR | 10-2008-0044325 A | 5/2008 |

* cited by examiner

F I G . 2
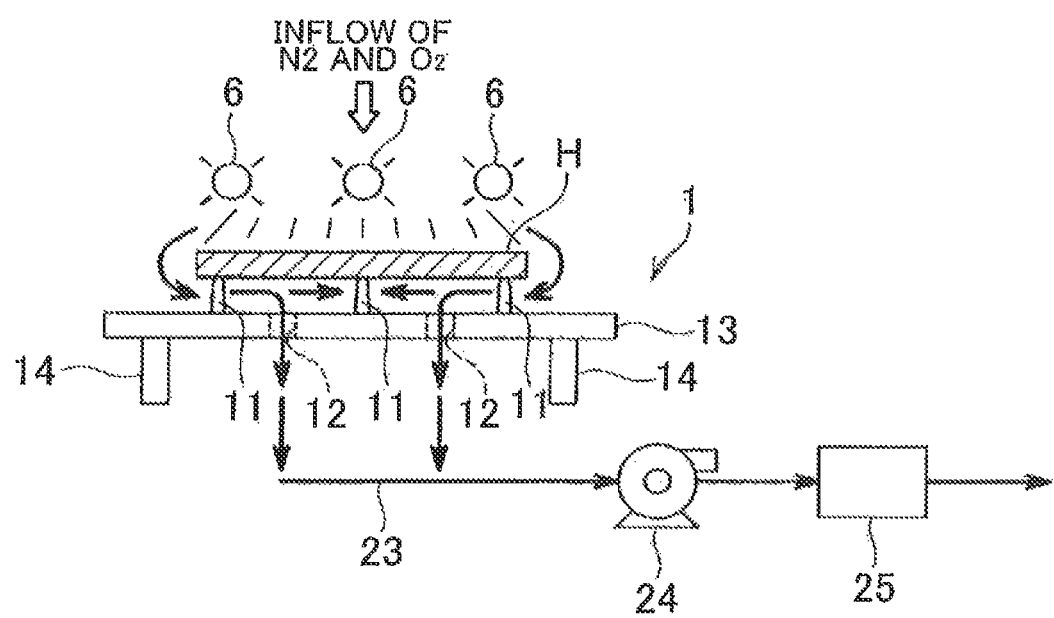

FIG. 6

| ITEM | UNIT | CONDITION |
|---|---|---|
| CONCENTRATION OF $O_2$ IN TREATMENT CHAMBER | % | 11~14 |
| FLOW RATE OF $N_2$ | NL/min | 300±100 |
| UV LAMP TYPE (WAVELENGTH) | nm | 172 |
| NUMBER OF UV LAMPS | NUMBER | 4 |
| INTEGRATED LIGHT QUANTITY | mJ/cm² | EQUAL TO OR LARGER THAN 124 |
| WORK TRANSPORT VELOCITY | mm/s | 80 |

SURFACE TREATMENT APPARATUS AND SURFACE TREATMENT METHOD

INCORPORATION BY REFERENCE

The disclosure of Japanese Patent Application No. 2014-026181 filed on Feb. 14, 2014 including the specification, drawings and abstract is incorporated herein by reference in its entirety.

BACKGROUND OF THE INVENTION

1. Field of the Invention

The invention relates to a surface treatment that imparts hydrophilicity.

2. Description of Related Art

A treatment of imparting hydrophilicity is carried out in various industrial fields. There is generally adopted a method in which oxygen is activated to generate ozone through the use of an energy wave, for example, ultraviolet light and a hydrophilic group is formed on a surface to be treated through the use of the ozone (Japanese Patent Application Publication No. 2012-200622 (JP-2012-200622 A)).

By the way, as for a fuel cell that employs a polymer electrolyte membrane (hereinafter referred to simply as "an electrolyte membrane") as an electrolyte, there is known a configuration in which a membrane electrode assembly that is obtained by joining electrode catalytic layers to both faces of the electrolyte membrane is sandwiched by separators. A gas that is supplied to the electrode catalytic layer flows through one face of each of the separators (this face will be referred to also as a gas face), and a cooling medium for cooling the fuel cell flows through the other face of each of the separators (this face will be referred to also as a cooling face). In each of these separators, the gas face is required to exhibit hydrophilicity in order to discharge the water produced through the generation of electric power by the fuel cell to the outside of the fuel cell. On the other hand, when cells are laminated and fastened, a gasket is glued to the cooling face so as to prevent reactive gas and coolant from leaking out. Therefore, the cooling face is required to exhibit hydrophilicity in order to enhance the adhesiveness.

With the surface treatment apparatus of Japanese Patent Application Publication No. 2012-200622 (JP-2012-200622 A), only one face of each of the separators can be subjected to a hydrophilization treatment. Therefore, in the case where both faces of each of the separators is subjected to the hydrophilization treatment, one of the faces is subjected to the hydrophilization treatment, and then the other face is subjected to the hydrophilization treatment. For this reason, a large quantity of labor and a long time are needed to carry out the treatment. Thus, there have been demands for a technology that makes it possible to reduce the quantity of labor and time for the hydrophilization treatment in the case where both the faces of each of the separators is subjected to the treatment. This technology has been desired not only for fuel cell separators but also for surface treatment apparatuses for treating various workpieces in common. Moreover, a reduction in cost, the saving of resources, the facilitation of manufacture, the enhancement of performance and the like have been desired in conventional surface treatment apparatuses.

SUMMARY OF THE INVENTION

A first aspect of the invention relates to a surface treatment apparatus comprising: a treatment chamber that accommodates a workpiece; a hydrophilic group generating gas supply portion that supplies a hydrophilic group generating gas that serves as a generation source of a hydrophilic group into the treatment chamber; an installation stand on which the workpiece is installed and which is equipped with an installation plate and a support member, the installation plate having a ventilation portion, and the support member being provided protrusively from the installation plate and supporting the workpiece with an air gap left between the workpiece and the installation plate; an irradiation device that irradiates the workpiece with an energy wave that induces activation of the hydrophilic group generating gas such that hydrophilicity is imparted to the workpiece; and a flow generation portion that generates a flow of at least part of the activated hydrophilic group generating gas such that the hydrophilic group generating gas flows via the ventilation portion of the installation plate and flows around into the air gap.

With the surface treatment apparatus according to this aspect of the invention, for example, when the workpiece is in the shape of a flat plate, hydrophilicity is imparted to the face of the workpiece that is irradiated with the energy wave, by the hydrophilic group generating gas that has been activated by the energy wave. Besides, the activated hydrophilic group generating gas is induced into the air gap between the workpiece and the installation plate, so hydrophilicity is also imparted to the face of the workpiece that is in contact with the support member (the face that is not irradiated with the energy wave) by the activated hydrophilic group generating gas. Accordingly, hydrophilicity can be imparted to both the faces of the workpiece by carrying out the treatment once, so the labor and time for the treatment can be reduced. Incidentally, even in the case where the workpiece is three-dimensional instead of being in the shape of a flat plate, hydrophilicity can also be imparted to the side that is in contact with the support member. Therefore, hydrophilicity can be imparted to the entire surface of the workpiece by carrying out the treatment once.

Besides, according to this aspect of the invention, at least one of various problems such as a reduction in cost, the saving of resources, the facilitation of manufacture, the enhancement of performance and the like can be solved.

The flow generation portion may be equipped with a suction portion that generates the flow of the activated hydrophilic group generating gas by sucking the activated hydrophilic group generating gas via the ventilation portion. In this manner, the flow of the activated hydrophilic group generating gas can be easily generated such that at least part thereof flows around into the air gap.

The ventilation portion may be formed in a region that is covered with the workpiece when the workpiece is installed on the support member. In this manner, the activated hydrophilic group generating gas can be caused to appropriately flow around into the air gap.

The ventilation portion may be formed in a region inside the support member. In this manner as well, the activated hydrophilic group generating gas can be caused to appropriately flow around into the air gap.

The flow generation portion may be equipped with an exhaust hole that is formed under the installation plate of the treatment chamber, and an exhaust mechanism that discharges a gas in the treatment chamber to an outside of the treatment chamber via the exhaust hole. In this manner, the gas between the workpiece and the installation plate is induced below the installation plate through the through-hole of the installation plate due to the flow of the gas in the treatment chamber that results from the discharge of the gas in the treatment chamber to the outside of the treatment chamber via the exhaust hole. Therefore, the entire surface of the workpiece can be subjected to the hydrophilization treatment with a simple configuration.

The exhaust hole may be formed through a floor of the treatment chamber. In this manner, the gas between the workpiece and the installation plate can be more appropriately induced below the installation plate via the throughhole of the installation plate.

The support member may be formed in such a manner as to taper toward a tip thereof from the installation plate side. In this manner, the area of contact between the workpiece and the support member becomes small, so a larger part of the workpiece can be hydrophilized.

The installation stand may be further equipped with a restriction member that is provided protrusively on a peripheral edge of the installation plate and that restricts movements of the workpiece in a surface direction of the installation plate. In this manner, the movements of the workpiece are restricted, so hydrophilicity can be more appropriately imparted thereto.

The energy wave may be ultraviolet light, and the hydrophilic group generating gas may be oxygen. In this manner, a transition from oxygen to ozone can be caused through the emission of ultraviolet light, and hydrophilicity can be more effectively imparted by ozone.

The surface treatment apparatus may be further equipped with an adjustment gas supply portion that supplies an adjustment gas for adjusting a concentration of the hydrophilic group generating gas in the treatment chamber, and an adjustment portion that adjusts the concentration of the hydrophilic group generating gas in the treatment chamber to a predetermined concentration. In this manner, the concentration of the hydrophilic group generating gas can be adjusted to a concentration suited to impart hydrophilicity to the workpiece.

The energy wave may be ultraviolet light, the hydrophilic group generating gas may be oxygen, the adjustment gas may be nitrogen, and the predetermined concentration may be 5 to 20%. Ultraviolet light is unlikely to be absorbed by nitrogen, so the concentration of oxygen can be adjusted to an appropriate concentration by nitrogen without hindering ultraviolet light from causing a transition from oxygen to ozone. Besides, the generation amount of ozone and the transmission intensity of ultraviolet light can be more appropriately made compatible with each other by adjusting the concentration of oxygen to the aforementioned concentration.

A second aspect of the invention relates to a surface treatment method for subjecting a workpiece to a surface treatment through the use of the surface treatment apparatus according to the first aspect of the invention. This surface treatment method is equipped with (a) a process of installing the workpiece on the installation stand, (b) a process of supplying the hydrophilic group generating gas into the treatment chamber, (c) a process of irradiating the workpiece installed on the installation stand that is arranged in the treatment chamber, with the energy wave, and (d) a process of generating a flow of a hydrophilic group generating gas activated by the energy wave, such that the hydrophilic group generating gas flows around into the air gap between the workpiece and the installation plate.

According to this surface treatment method, hydrophilicity can be imparted to both the faces of the workpiece by carrying out the treatment once.

The workpiece may be a workpiece that is designed as a platy body having a gas face through which a gas used for electric power generation in a fuel cell flows, and a cooling medium face through which a cooling medium for cooling the fuel cell flows. One side of the platy body may be the gas face, and the other side of the platy body may be the cooling medium face. In the aforementioned surface treatment method, the workpiece may be installed on the installation stand such that the cooling medium face faces the installation stand, in the process (a). The gas face of the workpiece may be irradiated with the energy wave in the process (c).

According to this surface treatment method, hydrophilicity can be imparted to both the faces, namely, the gas face and the cooling face of the fuel cell separator by carrying out the treatment once. The gas face of the fuel cell separator is reformed and hydrophilized by the energy wave. Therefore, higher hydrophilicity can be imparted to the gas face of the fuel cell separator than to the cooling face of the fuel cell separator.

The energy wave may be ultraviolet light. The hydrophilic group generating gas may be oxygen. The adjustment gas may be nitrogen. The surface treatment method may be further equipped with a process of adjusting a concentration of the hydrophilic group generating gas in the treatment chamber to 5 to 20%. In this manner, the generation amount of ozone and the transmission intensity of ultraviolet light can be more appropriately made compatible with each other.

A third aspect of the invention relates to a treatment method for imparting hydrophilicity to a surface of a workpiece in a treatment chamber. This treatment method includes introducing a hydrophilic group generating gas that serves as a generation source of a hydrophilic group into the treatment chamber, irradiating at least one face of the workpiece where the introduced hydrophilic group generating gas exists, with an energy wave that induces activation of the hydrophilic group generating gas, and generating a flow of the activated hydrophilic group generating gas from a region close to the face irradiated with the energy wave toward another face of the workpiece, by sucking at least part of the hydrophilic group generating gas in the treatment chamber. According to this treatment method, hydrophilicity can be imparted to both the faces of the workpiece by carrying out the treatment once.

Incidentally, the invention can be realized in various modes. For example, the invention can be realized in various modes such as a method of using a surface treatment apparatus, a method of manufacturing a fuel cell, a system of manufacturing a fuel cell, and the like.

BRIEF DESCRIPTION OF THE DRAWINGS

Features, advantages, and technical and industrial significance of an exemplary embodiment of the invention will be described below with reference to the accompanying drawings, in which like numerals denote like elements, and wherein:

FIG. 2 is an illustrative view showing the configuration of an installation stand according to the embodiment of the invention and the flow of gas in a treatment chamber;

FIG. 6 is a table showing treatment conditions in the surface treatment apparatus according to the embodiment of the invention;

DETAILED DESCRIPTION OF EMBODIMENT

Figure 1:
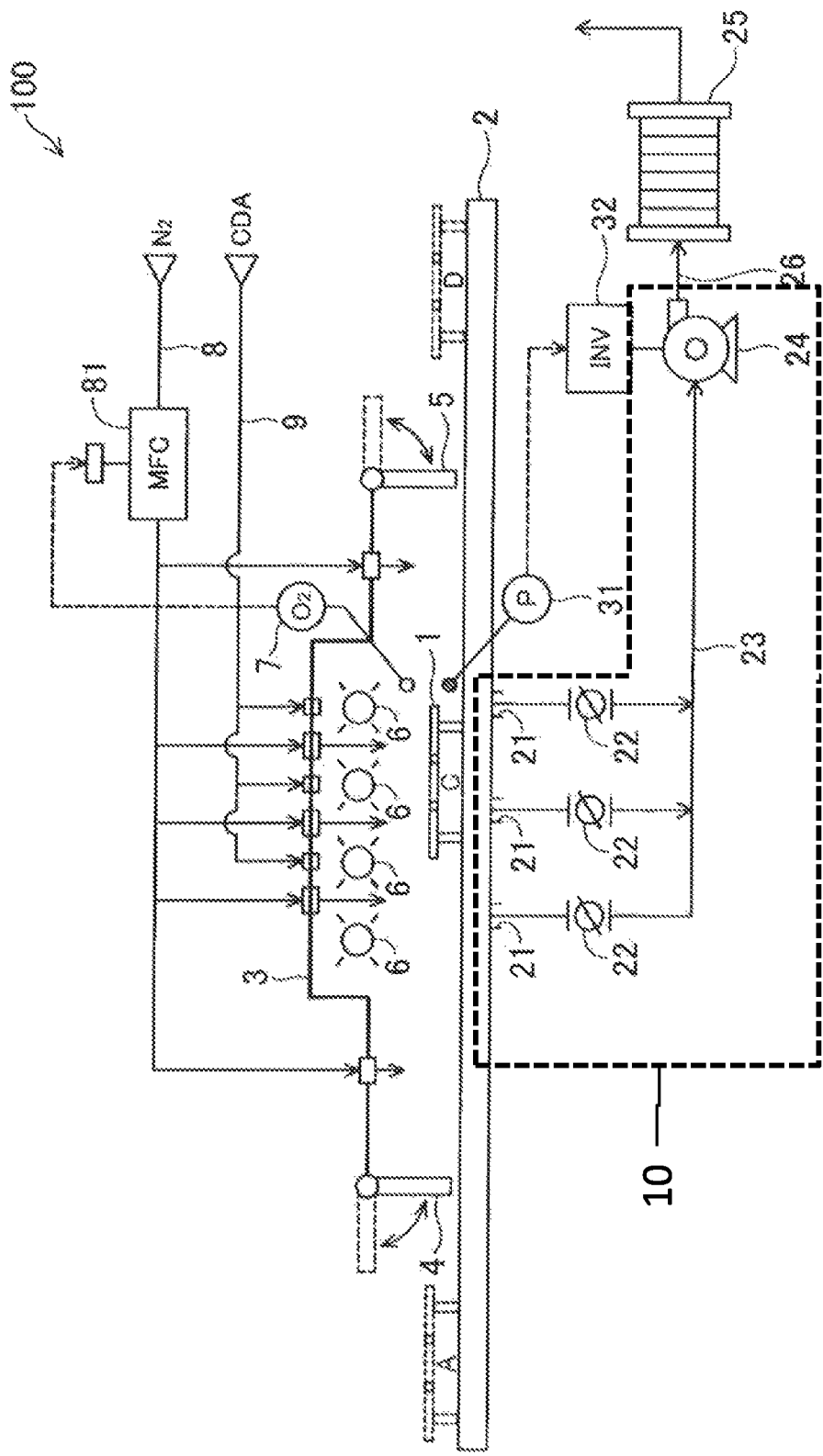
FIG. 1 is an illustrative view schematically showing the configuration of a surface treatment apparatus according to the embodiment of the invention.

A. Embodiment:

(A1) Configuration of Surface Treatment Apparatus:

FIG. 1 is an illustrative view schematically showing the configuration of a surface treatment apparatus according to the embodiment of the invention. As shown in FIG. 1, a surface treatment apparatus 100 is mainly equipped with an installation stand 1, a treatment chamber floor 2, a treatment chamber wall 3, an inlet shutter 4, an outlet shutter 5, four ultraviolet irradiation lamps 6, a nitrogen supply line 8 (an example of an, adjustment gas supply portion), an air supply line 9, an oxygen sensor 7, a pressure sensor 31, a flow generation portion 10 including exhaust holes 21 and a suction fan 24, and an ozone decomposition device 25.

The installation stand 1 is a stand on which a workpiece is installed (which will be described later in detail). The treatment chamber floor 2, the treatment chamber wall 3, the inlet shutter 4, and the outlet shutter 5 form a treatment chamber that accommodates the workpiece. When both the inlet shutter 4 and the outlet shutter 5 are closed, the treatment chamber is substantially sealed. As indicated by broken lines, the installation stand 1 is configured to be able to move on the treatment chamber floor 2 from the outside of the inlet shutter 4 (at a position A in the drawing) to the outside of the outlet shutter 5 (at a position D in the drawing). As will be described later, at first, the installation stand 1 is located outside the treatment chamber (at the position A in the drawing). After the workpiece is installed outside the treatment chamber, the installation stand 1 enters the treatment chamber from the opened shutter 4. After the workpiece is subjected to the surface treatment in the treatment chamber, the installation stand 1 leaves the treatment chamber from the opened shutter 5 (at the position D in the drawing). Incidentally, the installation stand 1 may be configured to be fixed in the treatment chamber. Besides, the treatment chamber may be completely sealed from the outside.

The four ultraviolet irradiation lamps 6 are placed on the treatment chamber wall 3 side in the treatment chamber, and radiate ultraviolet light. When the workpiece accommodated in the treatment chamber is irradiated with ultraviolet light, the face of the workpiece that is irradiated with ultraviolet light is reformed, and the oxygen in the treatment chamber is activated, so ozone is generated. In the present embodiment of the invention, the ultraviolet irradiation lamps 6 irradiate the workpiece accommodated in the treatment chamber with ultraviolet light having a wavelength of 172 nm, which is considered to be highly efficient in activating oxygen. Incidentally, the wavelength of the emitted ultraviolet light is not limited to the aforementioned wavelength, but may assume any value as long as its energy allows ozone to be generated via the activation of oxygen.

The air supply line 9 supplies a certain amount of clean dry air (denoted by CDA in the drawing) into the treatment chamber from the atmosphere via a dust filter (for removing particles) and a mist filter (for removing moisture). Incidentally, it is also appropriate to adopt a configuration in which clean dry air is supplied from a clean dry air supply device in which the clean air deprived of particles and moisture is stored.

The nitrogen supply line 8 supplies nitrogen into the treatment chamber from a nitrogen tank (not shown) in which pure nitrogen is stored. In the present embodiment of the invention, with a view to making the generation amount of ozone and the transmission intensity of ultraviolet light compatible with each other in the treatment chamber of the surface treatment apparatus 100, the concentration of oxygen in the treatment chamber is set to 11 to 14%. Pure nitrogen hardly absorbs ultraviolet light, so the concentration of oxygen in the treatment chamber is adjusted through the use of pure nitrogen. In the surface treatment apparatus 100, a mass flow controller 81 adjusts the flow rate of the nitrogen supplied into the treatment chamber, based on a measured value (an oxygen concentration) obtained by the oxygen sensor 7 that is arranged beside the installation stand 1 in the treatment chamber.

Three exhaust holes 21 are formed through the treatment chamber floor 2. The respective exhaust holes 21 are connected to a suction fan 24 (an example of a suction portion) via a pipeline 23. While the suction fan 24 is controlled through the use of an inverter 32 based on a measured value (a pressure) that is obtained by a pressure sensor 31 that is arranged in the treatment clamber, the gas in the treatment chamber is discharged through the use of a suction amount adjustment damper 22 that is provided on the pipeline 23, such that the pressure in the treatment chamber becomes slightly more negative than the atmospheric pressure (more negative by about 100 Pa). Thus, the ozone in the treatment chamber is restrained from leaking out from the treatment chamber.

The ozone decomposition device 25 is connected to the suction fan 24 by a pipeline 26. The ozone decomposition device 25 decomposes the ozone contained in the gas discharged from the treatment chamber via the exhaust holes 21, into oxygen, and discharges this oxygen into the atmosphere.

(A2) Configuration of Installation Stand:

FIG. 2 is an illustrative view showing the configuration of the installation stand according to the embodiment of the invention and the flow of the gas in the treatment chamber. The installation stand 1 is equipped with a platy installation plate 13, four legs 14 that support the installation plate 13, and three support bodies 11 that support a workpiece H. The support bodies 11 are formed in such a manner as to taper toward tips thereof from the installation plate 13 side, and support the workpiece H at points. The installation plate 13 is equipped with two ventilation portions 12 that are formed as through-holes. The number of support bodies 11 and the number of ventilation portions 12 should not be limited as stated in the present embodiment of the invention. An appropriate number of support bodies 11 and an appropriate number of ventilation portions 12 may be provided in consideration of the stability of the workpiece H and the flow of the gas. The shape of the support bodies 11 should not be limited as stated in the present embodiment of the invention. For example, the support bodies 11 may assume the shape of a circular cylinder or a quadrangular prism. The support bodies 11 are preferably shaped such that the area of contact with the workpiece H becomes small.

In the present embodiment of the invention, the ventilation portions 12 are formed close to a center in a region below the workpiece H when the workpiece H is installed. However, the ventilation portions 12 may be formed at the center or at either end. Furthermore, even in a region that is not located below the workpiece H, the ventilation portions 12 may be formed at such a position that the ozone generated above the workpiece H can pass through a gap between the installation plate 13 and the workpiece H. The ventilation portions 12 are not absolutely required to be through-holes. The ventilation portions 12 may assume any shape as long as the gas between the installation plate 13 and the workpiece H can pass through the installation plate 13. For example, the ventilation portions 12 may assume a slit-like shape.

In the surface treatment apparatus 100 according to the embodiment of the invention, the installation stand 1 is equipped with the support bodies 11, so there is formed a space between the workpiece H and the installation plate 13. Then, the ventilation portions 12 are formed through the installation plate 13. Therefore, as indicated by a thick arrow in FIG. 2, the ozone generated by the ultraviolet irradiation lamps 6 in a space above the workpiece H flows around into the gap between the workpiece H and the installation plate 13. The face of the workpiece H that is irradiated by the ultraviolet irradiation lamps 6 (hereinafter referred to also as a front face) is hydrophilized by the ozone generated in the treatment chamber, while the front face of the workpiece H is reformed by the ultraviolet irradiation lamps 6. On the other hand, the other face of the workpiece H (hereinafter referred to also as a back face) is hydrophilized by the ozone that has flowed around into the gap between the workpiece H and the installation plate 13. As for the degree of hydrophilization, although the front face that is directly irradiated with ultraviolet light by the ultraviolet irradiation lamps 6 is more intensely hydrophilized, the back face is also hydrophilized by ozone.

(A3) Embodiment of Surface Treatment:

(A3-1) Configuration of Separator as Workpiece: Next, the processes of a surface treatment will be described referring to an example in which a hydrophilization treatment of a cathode-side separator is executed through the use of the surface treatment apparatus 100 according to the present embodiment of the invention will be described. Thus, the configuration of the cathode-side separator as the workpiece will be described prior to the description of the surface treatment processes. The cathode-side separator in the present embodiment of the invention is a member that constitutes each of fuel cells, and is obtained by coating the surface of a titanium thin sheet (with a thickness of about 0.1 mm) with carbon.

Each of the fuel cells is constituted by laminating a fuel gas flow channel member and an oxidant gas flow channel member on both faces of a membrane electrode assembly, which is obtained by joining an electrode catalytic layer to each of both faces of an electrolyte membrane, respectively and sandwiching the laminated members by an anode-side separator and the cathode-side separator. In the case where these fuel cells are laminated to constitute a fuel cell stack, a coolant flow channel member is arranged between the cathode-side separator of each of the fuel cells and the anode-side separator of the fuel cell adjacent thereto. The face of the cathode-side separator that is in contact with the oxidant gas flow channel member will be referred to hereinafter as a gas face, and the face of the cathode-side separator that is in contact with the coolant flow channel member will be referred to hereinafter as a cooling face.

Figure 3:
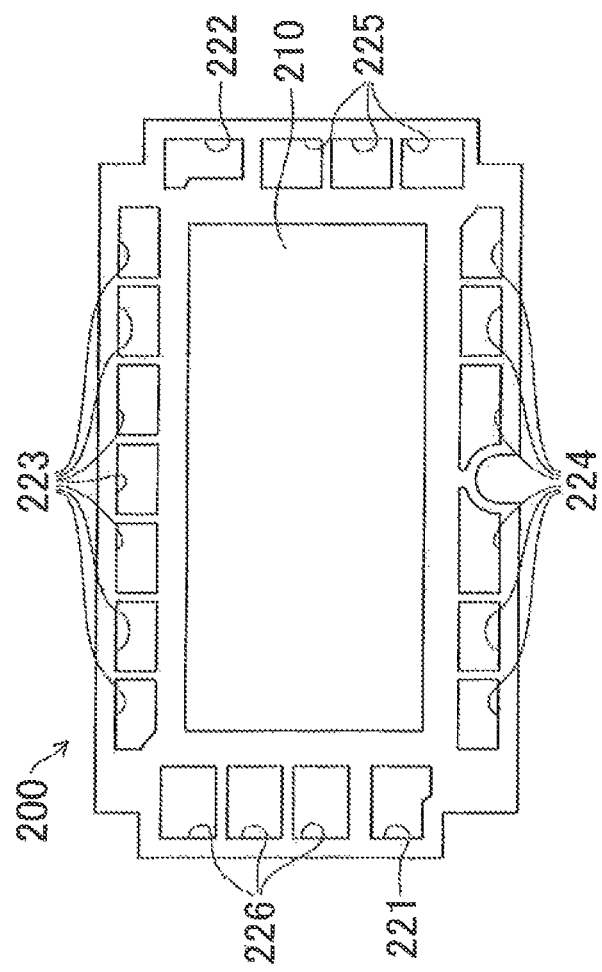
FIG. 3 is an illustrative view showing a gas face of a cathode-side separator in a plan view.

FIG. 3 is an illustrative view showing the gas face of the cathode-side separator in a plan view. As shown in FIG. 3, the gas face of the cathode-side separator assumes a substantially rectangular shape in a plan view, and is equipped, on a peripheral edge thereof, with a fuel gas supply through-hole 221, a fuel gas discharge through-hole 222, seven oxidant gas supply through-holes 223, seven oxidant gas discharge through-holes 224, three coolant supply through-holes 225, and three coolant discharge through-holes 226.

When a fuel cell stack is constituted by laminating a plurality of fuel cells, each of which is obtained by disposing gas flow channel members (not shown) on both faces of a membrane electrode assembly (not shown) respectively and sandwiching them by a cathode-side separator 200 and an anode-side separator (not shown), via a coolant flow channel member, a manifold through which fuel gas, oxidant gas and coolant are supplied to the respective fuel cells, and a manifold through which fuel gas, oxidant gas and coolant are discharged from the respective fuel cells are formed by these through-holes.

When the fuel cells generate electric power, fuel gas flows into a fuel gas flow channel member (not shown) via the fuel gas supply through-hole 221, and the fuel gas and the like that have been supplied to an anode and that have not been used to generate electric power are discharged to the outside of the fuel cell stack via the fuel gas discharge through-hole 222. Oxidant gas flows into an oxidant gas flow channel member (not shown) via the oxidant gas supply through-holes 223, and the oxidant gas and the like that have been supplied to a cathode and that have not been used to generate electric power are discharged to the outside of the fuel cell stack via the oxidant gas discharge through-holes 224.

A region 210 in FIG. 3 is a region that is in contact with the oxidant gas flow channel member (not shown). On the cathode side of each of the fuel cells, water is produced as electric power is generated. In order to discharge the produced water, the gas face of the cathode-side separator 200 is required to exhibit high hydrophilicity.

Figure 4:
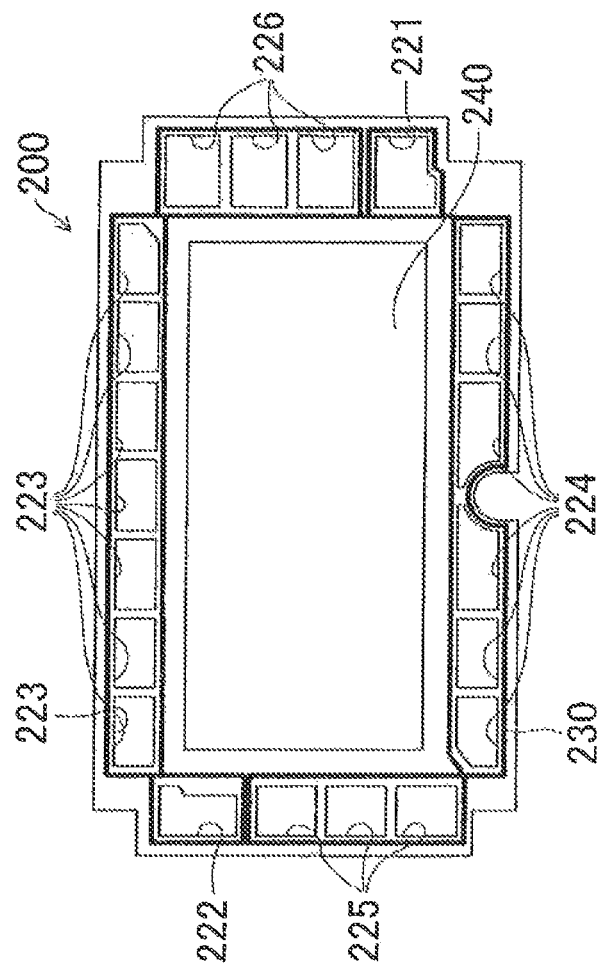
FIG. 4 is an illustrative view showing a cooling face of the cathode-side separator in a plan view.

FIG. 4 is an illustrative view showing the cooling face of the cathode-side separator in a plan view. FIG. 4 shows the back face of the cathode-side separator 200, which is located on the other side of the face shown in FIG. 3. As described above, in the case where the fuel cell stack is constituted, the cooling face of the cathode-side separator 200 is in contact with the cathode-side separator and the coolant flow channel member of adjacent ones of the fuel cells. Therefore, with a view to preventing the leakage of fuel gas, oxidant gas and coolant, there is glued a gasket that assumes such a shape as to surround a region 240 that is in contact with the respective through-holes and the coolant flow channel member. In FIG. 4, a location where the gasket is glued is indicated by a thick line 230. The gasket is not glued to the cathode-side separator 200 as a workpiece. The gasket may be glued either by a liquid adhesive or through thermal welding. The cooling face of the cathode-side separator 200 is required to exhibit hydrophilicity so as to enhance the adhesiveness of the gasket.

In the present embodiment of the invention, the cathode-side separator through which no flow channel is formed is exemplified. However, it is also acceptable to employ a cathode-side separator that is configured such that a flow channel is formed through the regions 210 and 240 in FIGS. 3 and 4 through press working. Incidentally, hydrophilicity may also be imparted to the anode-side separator.

Figure 5:
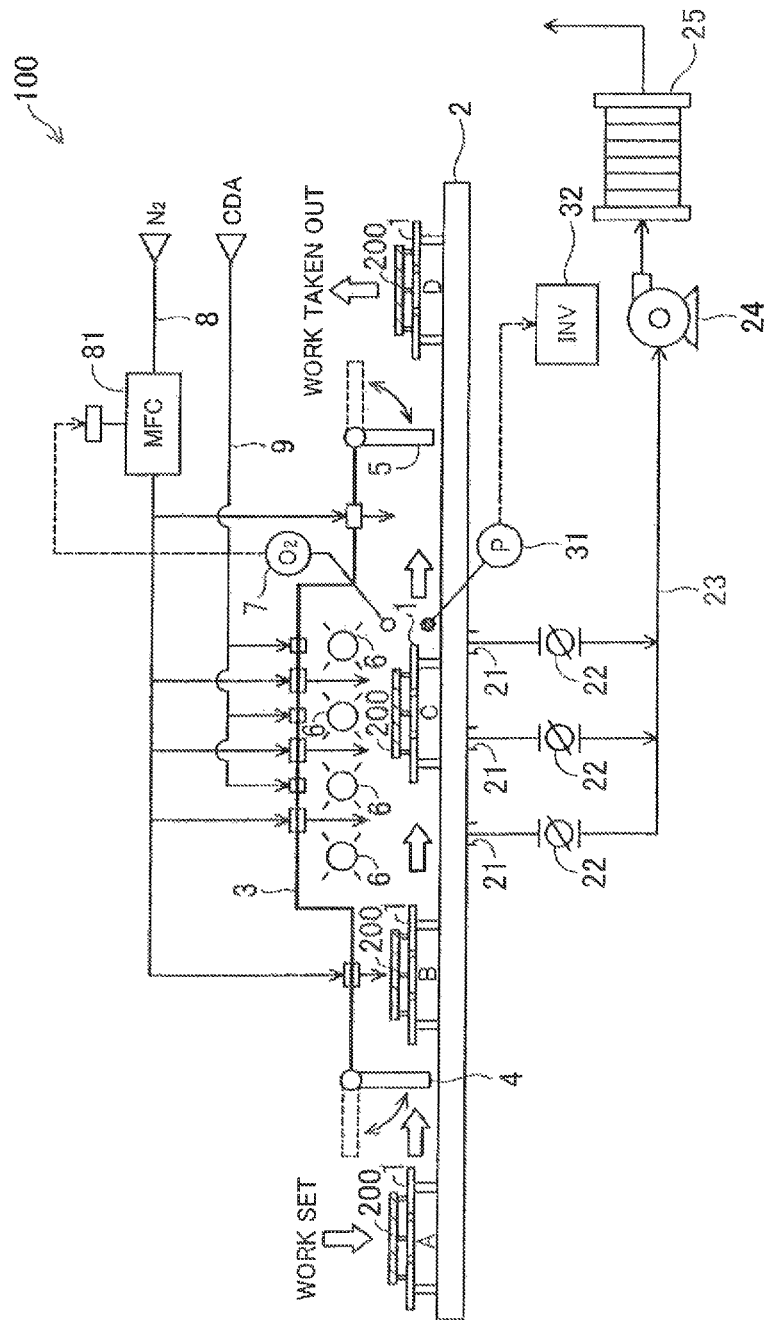
FIG. 5 is an illustrative view showing processes of a surface treatment by the surface treatment apparatus according to the embodiment of the invention.

(A3-2) Processes of Surface Treatment: FIG. 5 is an illustrative view showing processes of a surface treatment by the surface treatment apparatus according to the embodiment of the invention. FIG. 5 shows how the installation stand moves, and position-indicating reference symbols A to D are assigned to respective positions. FIG. 6 is a table showing treatment conditions in the surface treatment apparatus according to the embodiment of the invention.

In the present embodiment of the invention, as described above, the cathode-side separator 200 as a workpiece is subjected to a surface treatment. First of all, the inlet shutter 4 and the outlet shutter 5 are closed to seal the treatment chamber. Clean dry air and nitrogen are supplied into the treatment chamber, and the concentration of oxygen in the treatment chamber is adjusted to a prescribed concentration. As shown in FIG. 6, according to the present embodiment of the invention, the concentration of oxygen is adjusted to 11 to 14%. As will be described later, the flow rate of nitrogen is changed in accordance with the concentration of oxygen in the treatment chamber, within a range of 300±100 NL/min. The concentration of oxygen should not be limited to 11 to 14%. The concentration of oxygen may be 10 to 15% or 5 to 20%. It is preferable that the concentration of oxygen be 11 to 14%.

The cathode-side separator 200 as a workpiece (which is referred to also as a work) is set on the installation stand 1 such that the gas face and the cooling face become a front face and a back face respectively (at the position A in the drawing). The inlet shutter 4 is opened, and the installation stand 1 is moved. When the workpiece enters the treatment chamber, the inlet shutter 4 is closed (at the position B in the drawing). As shown in FIG. 6, the installation stand 1 moves at a speed of 80 mm/s, and transports the cathode-side separator 200. The concentration of oxygen in the treatment chamber changes through the opening/closing of the inlet shutter 4. Therefore, after the inlet shutter 4 is closed, the installation stand 1 stands still at that position (at the position B in the drawing) until the concentration of oxygen in the treatment chamber becomes equal to the prescribed concentration again.

When the concentration of oxygen in the treatment chamber becomes equal to 11 to 14%, the installation stand 1 is moved to a position in the vicinity of the center of the treatment chamber and below the ultraviolet irradiation lamps 6 (at the position C in the drawing). It should be noted herein that the gas face of the cathode-side separator 200 is irradiated with ultraviolet light by the ultraviolet irradiation lamps 6. Due to the emission of ultraviolet light by the ultraviolet irradiation lamps 6, the gas face of the cathode-side separator 200 is reformed, and the oxygen in the treatment chamber is activated to turn into ozone. The gas face of the cathode-side separator 200 is reformed, and hydrophilicity is imparted thereto by ozone. On the other hand, the cooling face of the cathode-side separator 200 is hydrophilized by the ozone produced in the treatment chamber.

When a predetermined time needed to hydrophilize the cathode-side separator 200 elapses after the installation stand 1 is moved below the ultraviolet irradiation lamps 6, the outlet shutter 5 is opened, and the installation stand 1 is moved to the outside of the treatment chamber (at the position D in the drawing). Then, the cathode-side separator 200 subjected to the surface treatment is taken out.

(A4) Effect of Embodiment: By irradiating the workpiece with ultraviolet light through the use of the ultraviolet irradiation lamps 6, the surface treatment apparatus 100 according to the present embodiment of the invention makes it possible to reform the surface of the workpiece, produce ozone from the oxygen in the treatment chamber, and impart hydrophilicity to the workpiece through the use of ozone. Besides, the region of the workpiece that is not irradiated with ultraviolet light can be hydrophilized by ozone by causing the ozone to flow around thereinto.

The surface treatment apparatus 100 according to the present embodiment of the invention makes it possible to reduce the number of ultraviolet irradiation lamps in comparison with a case where ultraviolet irradiation lamps are provided in such a manner as to irradiate both the faces of the workpiece with ultraviolet light. Therefore, the surface treatment apparatus 100 contributes to the reduction of cost, the saving of resources, and the facilitation of manufacture.

Figure 7:
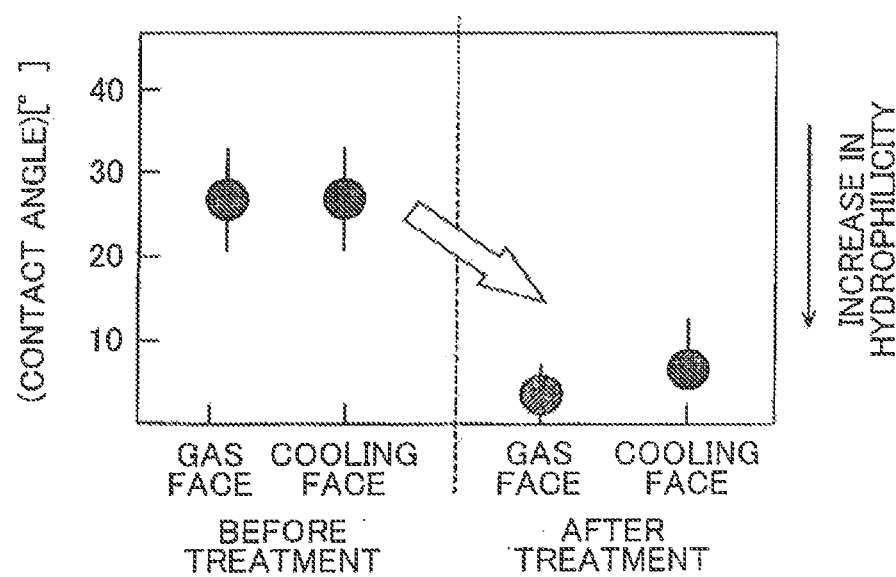
FIG. 7 is a view showing hydrophilicity of the cathode-side separator according to the embodiment of the invention before and after the surface treatment.

FIG. 7 is a view showing hydrophilicity before and after the surface treatment of the cathode-side separator according to the embodiment of the invention. As shown in the drawing, both the gas face and the cooling face of the cathode-side separator 200 have a smaller contact angle after the surface treatment than before the surface treatment. That is, the surface treatment apparatus 100 according to the present embodiment of the invention makes it possible to hydrophilize both the gas face and the cooling face of the cathode-side separator 200. Therefore, in the case where the cathode-side separator 200 is subjected to the surface treatment, the treatment time can be made shorter than when the treatment is carried out individually for each of the faces. If the cathode-side separator 200 to which hydrophilicity has been imparted by the surface treatment apparatus 100 according to the present embodiment of the invention is employed, the water produced as a result of the generation of electric power by the fuel cells can be discharged well, and the adhesion strength of the gasket glued to the cooling face can be enhanced.

As shown in FIG. 7, after the treatment, the contact angle of the gas face is smaller than the contact angle of the cooling face. That is, the gas face exhibits higher hydrophilicity than the cooling face. In the cathode-side separator 200, as described above, the gas face is required to exhibit higher hydrophilicity than the cooling face. In the present embodiment of the invention, the cathode-side separator 200 as the workpiece is set on the installation stand 1 such that the gas face and the cooling face become the front face and the back face respectively, so a desired level of hydrophilicity can be imparted to the cathode-side separator 200.

B. Modification Examples

This invention should not be limited to the aforementioned embodiment thereof. The invention can be carried out in various modes without departing from the gist thereof. For example, the following modifications are also possible.

(B1) First Modification Example

Figure 8:
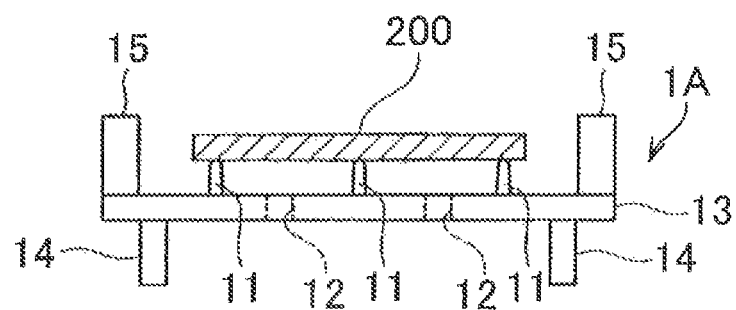
FIG. 8 is an illustrative view showing the overall configuration of an installation stand in a surface treatment apparatus according to a first modification example.

FIG. 8 is an illustrative view showing the overall configuration of an installation stand in a surface treatment apparatus according to the first modification example. The installation stand of the surface treatment apparatus according to the first modification example is different in configuration from that of the aforementioned embodiment of the invention. An installation stand 1A is equipped with a restriction member 15 in addition to the configuration of the installation stand 1 according to the aforementioned embodiment of the invention. The restriction member 15 is formed in the shape of a wall surrounding a peripheral edge of the installation plate 13. The cathode-side separator 200 is a thin flat plate of about 0.1 mm, and hence may deviate from an installation position on the installation stand due to the movements of gas in the treatment chamber. In the case where the cathode-side separator 200 is installed on the installation stand 1A according to the modification example, the outer periphery of the cathode-side separator 200 is surrounded by the restriction member 15. Therefore, the cathode-side separator 200 can be restrained from deviating from the installation position.

The configuration of the restriction member should not be limited to the aforementioned configuration. For example, a plurality of pillars or a hook-like body may be provided protrusively on the peripheral edge of the installation plate 13. In this manner as well, the cathode-side separator 200 can be restrained from deviating from the installation position.

(B2) Second Modification Example

In the aforementioned embodiment of the invention, oxygen (dry air) is used as the hydrophilic group generating gas that serves as the generation source of the hydrophilic group, and ultraviolet light is used as the energy wave that induces activation of the hydrophilic group generating gas. For example, however, X-rays, plasma discharge waves or the like can also be emitted instead of ultraviolet light. In this manner as well, an effect similar to that of the aforementioned embodiment of the invention can be obtained. Furthermore, nitrogen may be used instead of oxygen. In this case, a cyano group (CN) can be formed on the workpiece instead of the hydroxyl group. Therefore, hydrophilicity can be highly effectively imparted to the workpiece, as is the case with the aforementioned embodiment of the invention.

(B3) Third Modification Example

In the aforementioned embodiment of the invention, the gas in the treatment chamber is discharged to the outside of the treatment chamber via the exhaust holes 21 that are provided through the treatment chamber floor 2. Thus, the gas (containing ozone) between the cathode-side separator 200 and the installation plate 13 is induced below the installation plate 13 via the ventilation portions 12, and the ozone in the treatment chamber is induced to the cooling face side of the cathode-side separator 200. However, the invention should not be limited to this configuration. Any configuration is possible as long as the gas between the cathode-side separator 200 and the installation plate 13 can be induced below the installation plate 13 via the ventilation portions 12.

For example, the exhaust holes 21 may be formed under wall surfaces of the treatment chamber or the installation plate 13 of the shutters 4 and 5. Furthermore, the suction fan 24 may be arranged in the treatment chamber, the ventilation portions 12 and the suction fan may be directly connected to each other via a pipeline, and the gas between the cathode-side separator 200 and the installation plate 13 may be induced below the installation plate 13 via the ventilation portions 12. In this case, the sucked gas may be discharged again into the treatment chamber to be circulated.

Besides, it is also appropriate to adopt a configuration in which the ventilation portions 12 are not formed through the installation plate 13. It is also appropriate to adopt a configuration in which the gas between the cathode-side separator 200 and the installation plate 13 is sucked by the suction fan and circulated to an upper portion of the cathode-side separator 200, and the ozone generated in the cathode-side separator 200 is induced between the cathode-side separator 200 and the installation plate 13 through the use of a circulation flow of the gas.

What is claimed is:

1. A surface treatment apparatus comprising: a treatment chamber that accommodates a workpiece; a hydrophilic group generating gas supply portion that supplies a hydrophilic group generating gas that serves as a generation source of a hydrophilic group into the treatment chamber; an installation stand on which the workpiece is installed and which is equipped with an installation plate and a support member, the installation plate having a ventilation portion, and the support member being provided protrusively from the installation plate and supporting the workpiece with an air gap left between the workpiece and the installation plate; an irradiation device that irradiates the workpiece on the support member of the installation stand in the treatment chamber with an energy wave that induces activation of the hydrophilic group generating gas such that hydrophilicity is imparted to the workpiece; and a flow generation portion that generates a flow of at least part of the activated hydrophilic group generating gas such that the hydrophilic group generating gas flows via the ventilation portion of the installation plate and flows around into the air gap.

2. The surface treatment apparatus according to claim 1, wherein
the flow generation portion is equipped with a suction portion that generates the flow of the activated hydrophilic group generating gas by sucking the activated hydrophilic group generating gas via the ventilation portion.

3. The surface treatment apparatus according to claim 1, wherein
the ventilation portion is formed in a region that is covered with the workpiece when the workpiece is installed on the support member.

4. The surface treatment apparatus according to claim 1, wherein
the ventilation portion is formed in a region inside the support member.

5. The surface treatment apparatus according to claim 1, wherein
the flow generation portion is equipped with an exhaust hole that is formed under the installation plate of the treatment chamber, and an exhaust mechanism that discharges a gas in the treatment chamber to an outside of the treatment chamber via the exhaust hole.

6. The surface treatment apparatus according to claim 5, wherein
the exhaust hole is formed through a floor of the treatment chamber.

7. The surface treatment apparatus according to claim 1, wherein
the support member is formed in such a manner as to taper toward a tip thereof from the installation plate side.

8. The surface treatment apparatus according to claim 1, wherein
the installation stand is further equipped with a restriction member that is provided protrusively on a peripheral edge of the installation plate and that restricts movements of the workpiece in a surface direction of the installation plate.

9. The surface treatment apparatus according to claim 1, wherein
the energy wave is ultraviolet light, and
the hydrophilic group generating gas is oxygen.

10. The surface treatment apparatus according to claim 1, further comprising:
an adjustment gas supply portion that supplies an adjustment gas for adjusting a concentration of the hydrophilic group generating gas in the treatment chamber; and
an adjustment portion that adjusts the concentration of the hydrophilic group generating gas in the treatment chamber to a predetermined concentration.

11. The surface treatment apparatus according to claim 10, wherein
the energy wave is ultraviolet light,
the hydrophilic group generating gas is oxygen,
the adjustment gas is nitrogen, and
the predetermined concentration is 5 to 20%.

12. The surface treatment apparatus according to claim 1, further comprising: a treatment chamber floor that moves the installation stand into the treatment chamber.

* * * * *